United States Patent
Takashima et al.

(10) Patent No.: US 10,256,292 B2
(45) Date of Patent: Apr. 9, 2019

(54) VERTICAL MOSFET

(71) Applicant: FUJI ELECTRIC CO., LTD., Kanagawa (JP)

(72) Inventors: Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 154 days.

(21) Appl. No.: 15/335,459

(22) Filed: Oct. 27, 2016

(65) Prior Publication Data

US 2017/0170258 A1 Jun. 15, 2017

(30) Foreign Application Priority Data

Dec. 11, 2015 (JP) .................................. 2015-242234

(51) Int. Cl.
| | |
|---|---|
| *H01L 29/04* | (2006.01) |
| *H01L 29/20* | (2006.01) |
| *H01L 29/10* | (2006.01) |
| *H01L 29/78* | (2006.01) |

(52) U.S. Cl.
CPC ........ *H01L 29/045* (2013.01); *H01L 29/1095* (2013.01); *H01L 29/2003* (2013.01); *H01L 29/7802* (2013.01); *H01L 29/7813* (2013.01)

(58) Field of Classification Search
None
See application file for complete search history.

(56) References Cited

U.S. PATENT DOCUMENTS

2007/0114567 A1* 5/2007 Matocha ........... H01L 29/42316
257/192
2011/0180813 A1 7/2011 Harada et al.

FOREIGN PATENT DOCUMENTS

JP H10-107263 A 4/1998

* cited by examiner

*Primary Examiner* — Cory W Eskridge

(57) ABSTRACT

In order to improve the dynamic characteristics of a vertical MOSFET using GaN, it is an objective of the present invention to reduce the resistance of a current path with a long hole movement distance in a p-type well. Provided is a vertical MOSFET including a gallium nitride layer having a main surface that is a non-polar surface; a p-type well region that is provided with a stripe shape in the main surface of the gallium nitride layer; and a stripe-shaped electrode provided above the p-type well region. Hole mobility is higher in a direction orthogonal to an extension direction of the stripe-shaped electrode than in the extension direction, among directions in a plane parallel to the main surface.

3 Claims, 16 Drawing Sheets

VERTICAL MOSFET

The contents of the following Japanese patent application are incorporated herein by reference:
NO. 2015-242234 filed in JP on Dec. 11, 2015.

BACKGROUND

1. Technical Field

The present invention relates to a vertical MOSFET.

2. Related Art

It is known that small steps in a stepped shape on a surface of an silicon carbide substrate trap carriers, thereby reducing mobility. Therefore, the (0001) surface is designated as the main surface and an off-angle is formed in the <11-20> direction, such that the current does not cut across these small steps, such as shown in Patent Document 1, for example. Furthermore, by setting the off-angle to be greater than or equal to 50° and less than or equal to 60° relative to the {0001} surface of the silicon carbide substrate, the interface trap density is reduced and the channel mobility is improved, as shown in Patent Document 2, for example. In this way, in a silicon carbide substrate, attempts are made to improve the mobility by reducing the carrier trapping. The mobility can also be expressed as the static characteristics of the semiconductor device during conduction.

Patent Document 1: Japanese Patent Application Publication No. H10-107263

Patent Document 2: International Publication WO 2010/116886

The inventors of the invention according to the present application confirmed that gallium nitride (abbreviated below as GaN) has hole mobility anisotropy according to the crystal axis direction. The hole mobility affects the dynamic characteristics when the semiconductor device is turned ON/OFF. For example, in a p-type well region where a channel region of a MOSFET (Metal-Oxide-Semiconductor Field-Effect Transistor) is formed, the dynamic characteristics of the MOSFET become worse when the resistance in the direction in which the hole current flows is higher. Due to the resistance per unit length of the current path, the resistance becomes higher when the hole movement distance is longer.

Specifically, when an ON voltage is applied to the gate, the charging rate of the pn junction capacitance between the p-type well region and the n-type drift layer becomes slower. Therefore, the switching characteristics become worse when the semiconductor device is ON. In addition, due to a transient response during the turn-OFF immediately after the OFF voltage is applied to the gate, the resistance of the p-type well region causes the potential rise of the p-type well region. As a result, dielectric breakdown occurs between the p-type well region and metal electrode. In addition, when the potential of the p-type well region rises, there is a problem that the parasitic BJT (Bipolar Junction Transistor) of the MOSFET is turned ON.

Therefore, in order to improve the dynamic characteristics of a vertical MOSFET using GaN, it is an objective of the present invention to reduce the resistance of a current path with a long hole movement distance in a p-type well.

SUMMARY

According to a first aspect of the present invention, provided is a vertical MOSFET comprising a gallium nitride layer, a p-type well region, and a stripe-shaped electrode. The gallium nitride layer may have a main surface that is a non-polar surface. The p-type well region may be provided with a stripe shape in the main surface of the gallium nitride layer. The stripe-shaped electrode may be provided above the p-type well region. Hole mobility may be higher in a direction orthogonal to an extension direction of the stripe-shaped electrode than in the extension direction, among directions in a plane parallel to the main surface.

In a case where the main surface is in an m plane, the direction orthogonal to the extension direction may be a <11-20> direction.

In a case where the main surface is an a plane, the direction orthogonal to the extension direction may be a <1-100> direction.

The vertical MOSFET may further comprise a p-type contact region, an n-type source region, a gate insulating film, a gate electrode, and a drain electrode. The p-type contact region and the n-type source region may be provided in the main surface side of the p-type well region. The gate insulating film may be provided at least in a region on top of the p-type contact region and the n-type source region. The gate electrode may be provided on top of the gate insulating film. The drain electrode may be provided in contact with another main surface of the gallium nitride layer positioned on a side opposite the main surface. The stripe-shaped electrode may be a source electrode provided on top of the p-type contact region and the n-type source region.

The vertical MOSFET may further comprise a p-type contact region and an n-type type source region, a trench portion, a gate insulating film, a gate electrode, and a drain electrode. The p-type contact region and the n-type source region may be provided in a main surface side of the p-type well region. The trench portion may have side walls and a bottom portion, and the side walls may be in contact with the p-type well region. The gate insulating film may be provided in contact with the side walls and the bottom portion of the trench portion. The gate electrode may be provided in contact with the gate insulating film. The drain electrode may be provided in contact with another main surface of the gallium nitride layer positioned on a side opposite the main surface. The stripe-shaped electrode may be a source electrode provided on top of the p-type contact region and the n-type source region.

According to a second aspect of the present invention, provided is a vertical MOSFET comprising a gallium nitride layer and a p-type well region. The gallium nitride layer may have a main surface in a non-polarized plane. The p-type well region may be provided on a main surface of the gallium nitride layer. In the p-type well region, hole mobility in a first direction, in which a distance travelled by holes is longest, may be higher than the hole mobility in a second direction that is orthogonal to the first direction in a plane parallel to the main surface.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1A:
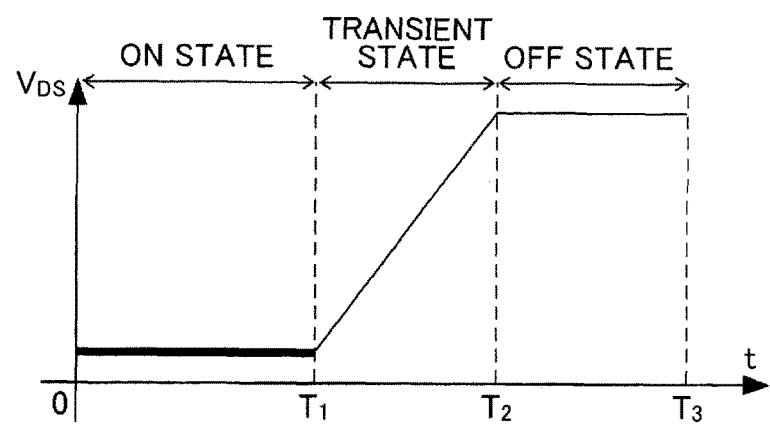
FIG. 1A shows the change over time of the voltage $V_{DS}$.
Figure 1B:
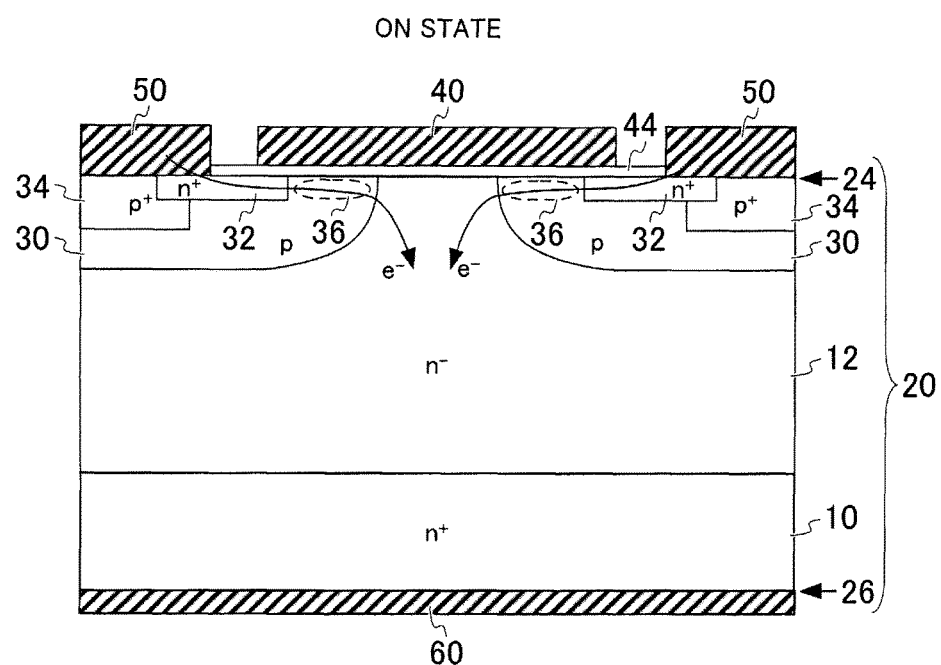
FIG. 1B shows the ON state of the vertical MOSFET.

FIGS. 1A to 4B are drawings for describing the ON state, the transient state, and the OFF state of a vertical MOSFET. FIG. 1A shows the change over time of the voltage $V_{DS}$. FIG. 1B shows the ON state of the vertical MOSFET. In this example, $0 \leq t < T_1$ is the ON state, $T_1 \leq t < T_2$ is the transient state, and $T_2 \leq t \leq T_3$ is the OFF state. The ON state in this example is a steady state in which a channel region 36 is formed in a p-type well region 30 and an electron current flows from a source electrode 50 to a drain electrode 60. In the ON state, the potential difference (voltage $V_{DS}$) between an n$^+$-type source region 32 and an n$^+$-type GaN substrate 10 (also referred to as a drain region) is lower than in the other states.

The vertical MOSFET of this example includes a GaN layer 20, a gate insulating film 44, a gate electrode 40, a source electrode 50, and a drain electrode 60. The GaN layer 20 includes the n$^+$-type GaN substrate 10 and an n$^-$-type GaN layer 12 formed epitaxially on top of the n$^+$-type GaN substrate 10. The GaN layer 20 has a p-type well region 30 in a main surface 24 thereof. The n$^+$-type source region 32 and a p$^+$-type contact region 34 are formed in the p-type well region 30.

In this Specification, n and p respectively refer to a state in which electrons are the majority carrier and a state in which holes are the majority carrier. The "+" and "−" signs written to the upper right of "n" and "p" respectively mean that the carrier concentration is higher than in a case where a "+" sign is not written and that the carrier concentration is lower than in a case where a "−" sign is not written. When simply "n-type" is used, this "n-type" can include n$^+$-type and n$^-$-type. Similarly, when simply "p-type" is used, this "p-type" can include p$^+$-type and p$^-$-type.

On the main surface 24 of the GaN layer 20, the source electrode 50 is provided in direct contact with the n$^+$-type source region 32 and the p$^+$-type contact region 34. Furthermore, the drain electrode 60 is provided in direct contact with the other main surface 26 of the GaN layer 20. A ground potential may be applied to the source electrode 50, and a power supply voltage ($V_{DD}$) may be applied to the drain electrode 60.

A gate insulating film 44 is provided in direct contact with the main surface 24 of the GaN layer 20. Furthermore, a gate electrode 40 is provided on top of and in contact with the gate insulating film 44. In this example, when a positive voltage is applied to the gate electrode 40, the channel region 36, which is an inversion carrier layer, is formed in the p-type well region 30 directly below the gate electrode 40. As a result, an electron current flows through the source electrode 50, the n$^+$-type source region 32, the channel region 36, the n$^-$-type GaN layer 12, the n$^+$-type GaN substrate 10, and the drain electrode 60, in the stated order.

Figure 2A:
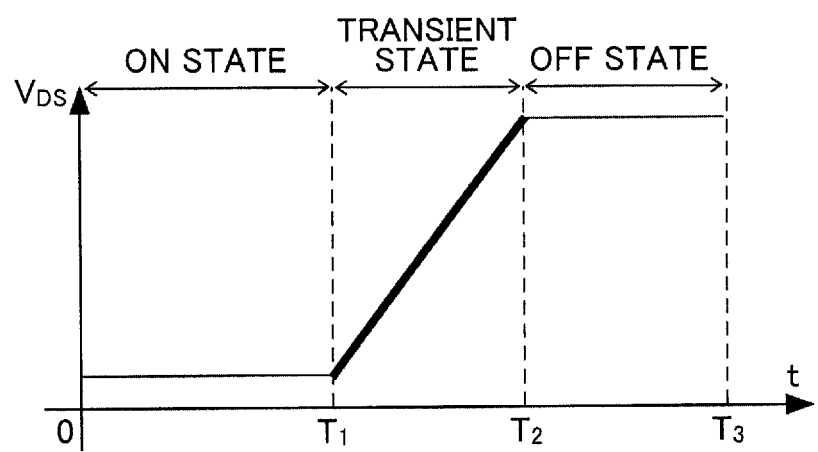
FIG. 2A shows the change over time of the voltage $V_{DS}$.
Figure 2B:
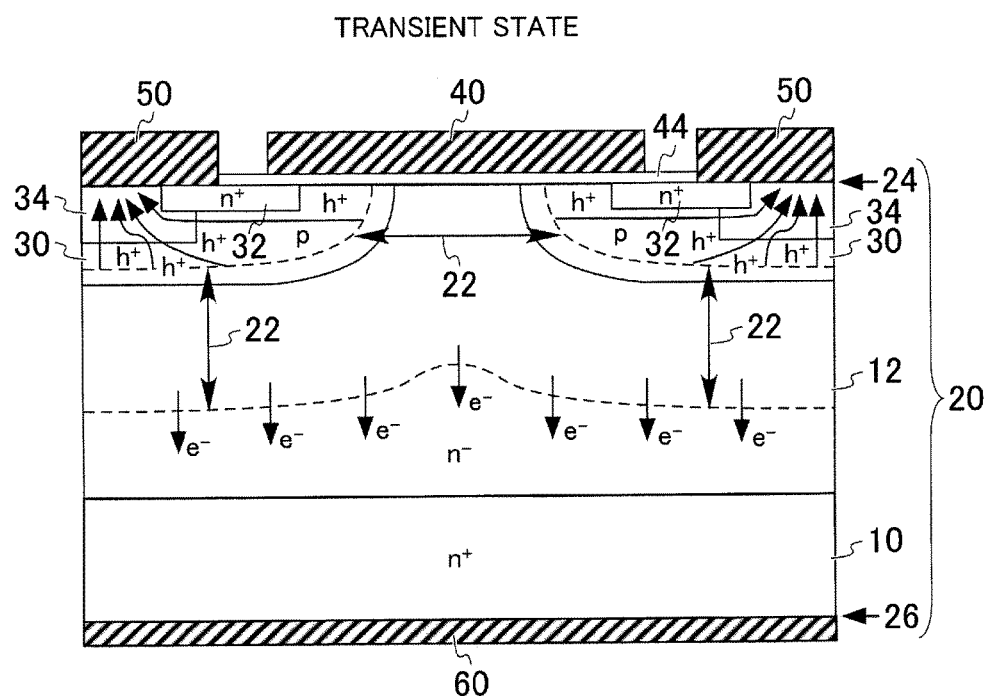
FIG. 2B shows the transient state of the vertical MOSFET.

FIG. 2A shows the change over time of the voltage $V_{DS}$. FIG. 2B shows the transient state of the vertical MOSFET. In the transient state of this example, the positive voltage applied to the gate electrode 40 becomes zero or a negative voltage. As a result, the channel region 36 disappears. In the transient state, formation of a depletion layer 22 progresses from the pn junction between the p-type well region 30 and the n$^-$-type GaN layer 12. During formation of the depletion layer 22, holes (h$^+$) are pulled out from the p-type well region 30 to the p$^+$-type contact region 34, and electrons (e$^-$) are pulled out from the n$^-$-type GaN layer 12 to the n$^+$-type GaN substrate 10. In other words, the transient state is a dynamic state in which pulling out of the holes (h$^+$) and electrons (e$^-$) progresses.

Figure 3A:
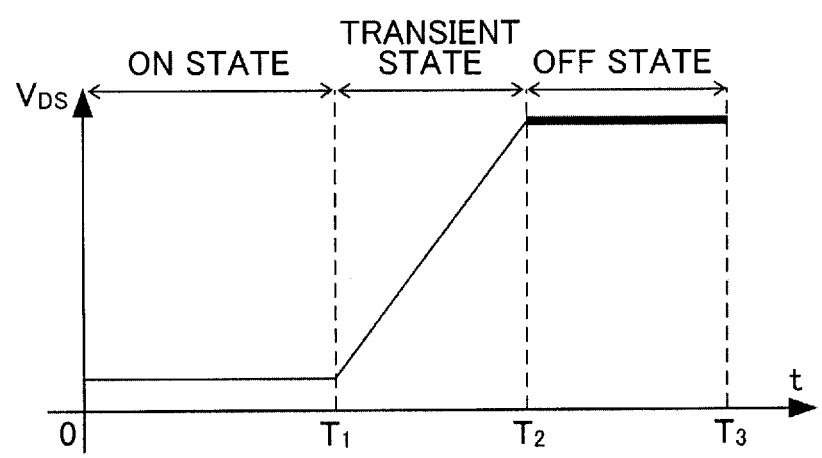
FIG. 3A shows the change over time of the voltage $V_{DS}$.
Figure 3B:
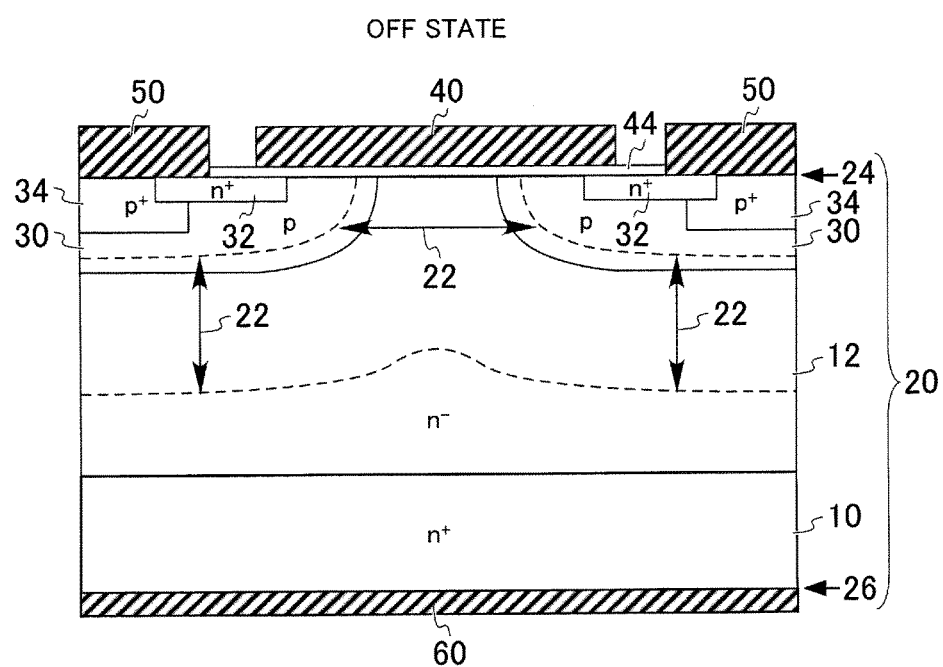
FIG. 3B shows the OFF state of the vertical MOSFET.

FIG. 3A shows the change over time of the voltage $V_{DS}$. FIG. 3B shows the OFF state of the vertical MOSFET. The OFF state of this example is a steady state in which the pulling out of the holes (h$^+$) and electrons (e$^-$) has been completed. In other words, the OFF state is a steady state in which the expansion of the depletion layer 22 has stopped. The vertical MOSFET may again transition to the ON state after the OFF state. In such a case, the transition may occur from the OFF state to the ON state via a transient state in which injection of holes (h$^+$) and electrons (e$^-$) progresses.

Figure 4A:
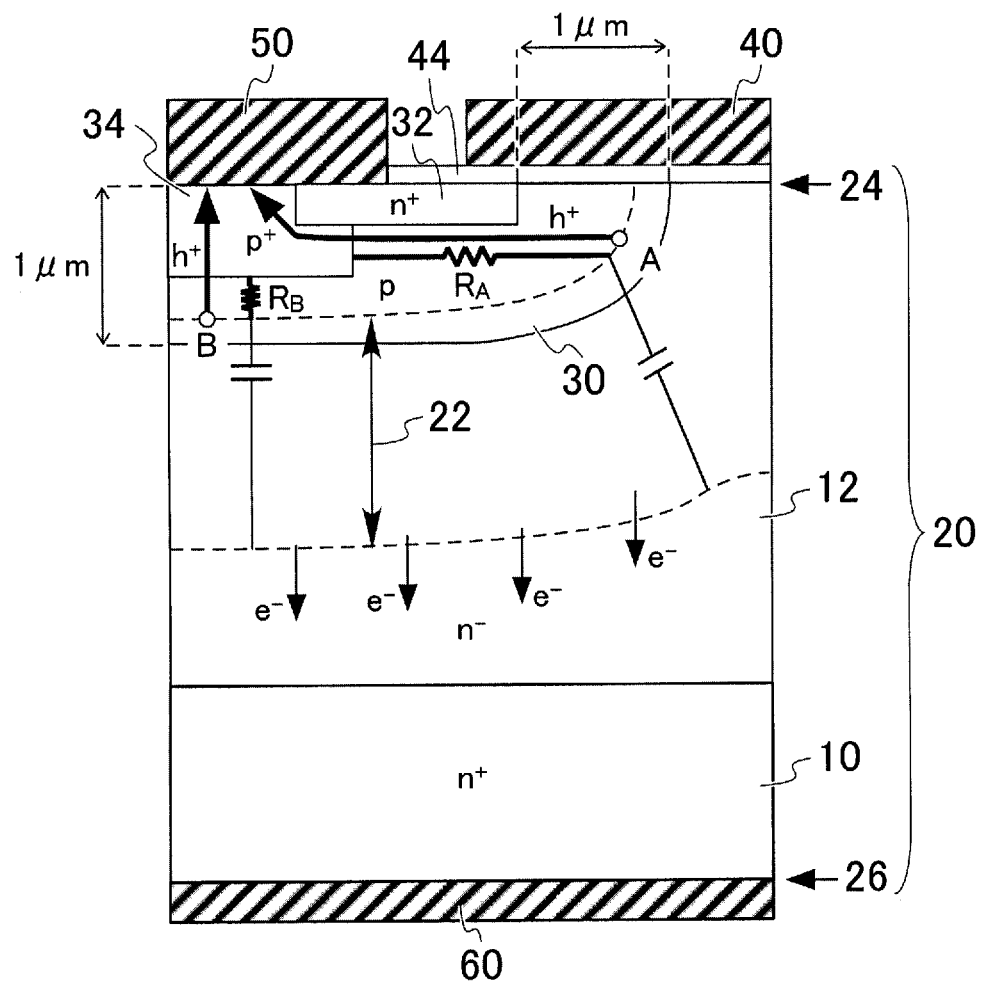
FIG. 4A shows an RC circuit in a path passing through position A and position B in the transient state of the vertical MOSFET.

FIG. 4A shows an RC circuit in a path passing through position A and position B in the transient state of the vertical MOSFET. In the transient state, holes (h$^+$) are pulled out from the end of the p-type well region 30 closest to the depletion layer 22 (shown by the dotted line) to the source electrode 50 via the p$^+$-type contact region 34. In the transient state, the path passing through position A is a current path having the longest movement distance for the holes (h$^+$). On the other hand, in the transient state, the path passing through position B is a current path having the shortest movement distance for the holes (h$^+$).

Here, if it is assumed that the resistance of the p-type well region 30 is uniform regardless of the location excluding the depletion layer 22, the resistance $R_A$ of the path passing through position A is greater than the resistance $R_B$ of the path passing through position B. In other words, $R_B < R_A$. The resistance $R_A$ and the resistance $R_B$ are connected respectively in series to a capacitor as an equivalent circuit element for the depletion layer 22, thereby forming the RC circuit.

In a usual MOSFET, the depth of the p-type well region 30 is from 0.5 μm to 1 μm and the channel region (the region in which the channel region 36 can be formed) is approximately from 1 μm to 1.5 μm. Furthermore, the shortest straight distance from position A to the p$^+$-type contact region 34 is approximately from 1.5 μm to 4.0 μm. Yet further, the shortest straight distance from position B to the p$^+$-type contact region 34 is approximately from 0.2 μm to 0.5 μm. Since the path length is proportional to the resistance, the resistance $R_A$ of the path passing through position A is larger than the resistance $R_B$ of the path passing through position B. If the path lengths are taken into consideration, in a usual MOSFET, even when the resistance of the p-type well region 30 is not uniform, the resistance $R_B$ becomes smaller than the resistance $R_A$ in most case.

Figure 4B:
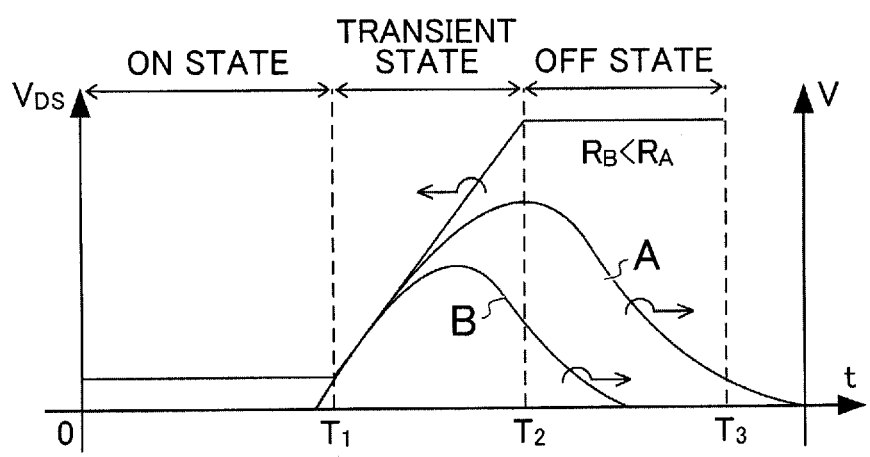
FIG. 4B shows the schematic of the change over time of the voltage V at position A and position B.

FIG. 4B shows the schematic of the change over time of the voltage V at position A and position B. The voltage characteristic of position A is shown by leader line A, and the voltage characteristic of position B is shown by leader line B. In the transient state, the voltage V increases sharply due to the resistance R. As shown in the drawing, the increase of the voltage V is more sudden for leader line A, which corresponds to a larger resistance R, than for leader line B. When the potential of the p-type well region 30 rises significantly, there are problems that dielectric breakdown occurs between the p-type well region 30 and the gate electrode 40, and that the parasitic BJT is mistakenly turned ON, as described above. Therefore, in order to improve the dynamic characteristics, it is desirable to decrease the resistance of the current path having a longer movement distance for the holes ($h^+$) in the p-type well region 30.

Figure 5:
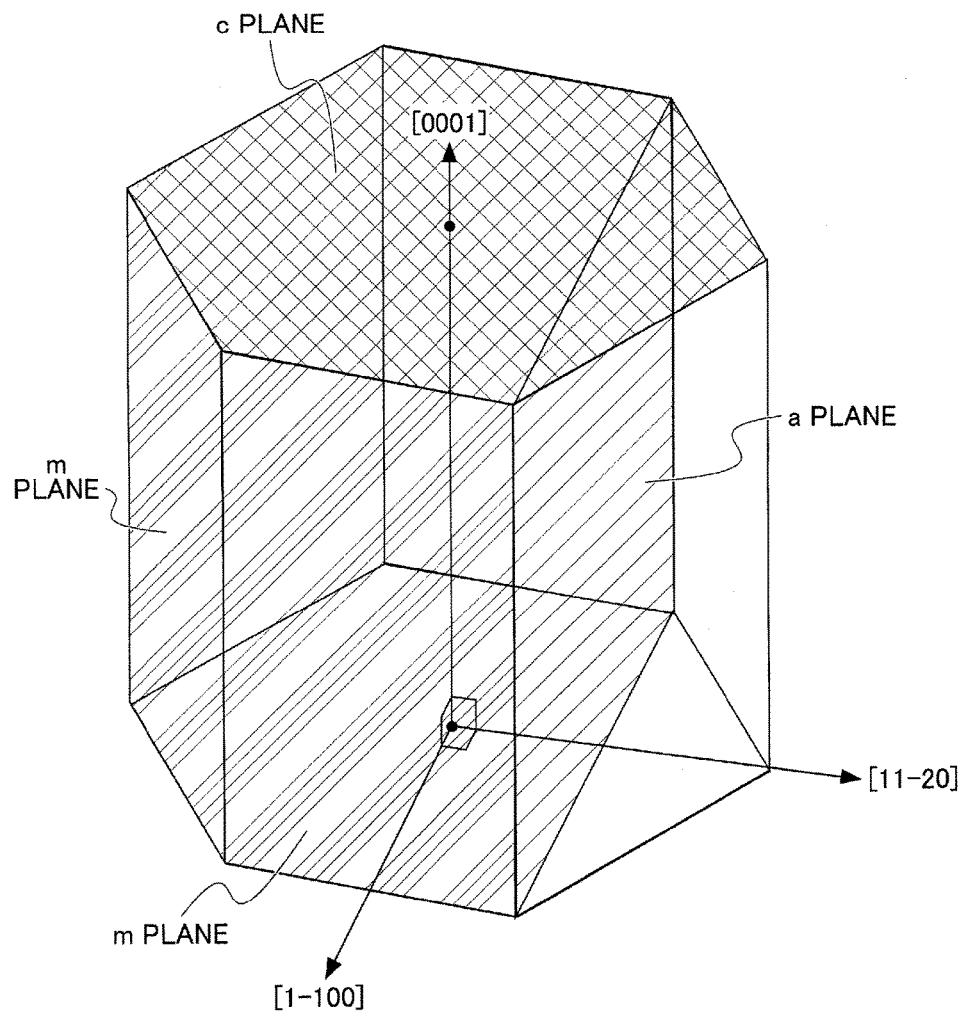
FIG. 5 shows plane indices and direction indices of a hexagonal lattice.

FIG. 5 shows plane indices and direction indices of a hexagonal lattice. The GaN crystal has a hexagonal lattice. In the hexagonal lattice, the (0001) plane is referred to as the c plane, the (1-100) plane is referred to as the m plane, and the (11-20) plane is referred to as the a plane. In this Specification, the symbols "−1" and "−2" used as mirror indices are equivalent to the expressions of bar notation with numerals. The c plane is referred to as a polar plane, the m plane and the a plane are referred to as non-polar planes. In FIG. 5, the c plane indicates the planes of the top surface and the bottom surface of a hexagonal pillar. Furthermore, the m plane refers to the six side surfaces of the hexagonal pillar. The six side surfaces are equivalent surfaces that are each caused by the six-fold symmetry of the GaN crystal. Furthermore, the a plane refers to the cross section shown in FIG. 5 and to planes equivalent thereto.

Here, [0001] indicates a direction perpendicular to the c plane. The <0001> direction includes all directions parallel to the [0001] direction. The [1-100] direction indicates a direction perpendicular to the m plane. The <1-100> direction includes all directions parallel to the [1-100] direction. The [11-20] direction indicates a direction perpendicular to the a plane. The <11-20> direction includes all directions parallel to the [11-20] direction.

The inventors of the invention according to the present application confirmed that the mobility of the holes is anisotropic in the non-polar planes of the GaN. Specifically, in a case where the main surface of a GaN crystal is in the m plane, the hole mobility is seen to be higher in the <11-20> direction than in the <0001> direction. This can be expressed simply as $\mu c < \mu a$.

In the c plane, which is a polar plane, the hole mobility is seen to be approximately equal in the <11-20> direction and the <1-100> direction. This can be expressed simply as $\mu a \approx \mu m$. From the above facts, in a case where the main surface is in the a plane, it can be inferred that the hole mobility is higher in the <1-100> direction than in the <0001> direction. This can be expressed simply as $\mu c < \mu m$.

In light of the above facts, the current path having the longest hole movement distance may be set in the <11-20> direction if the main surface is in the m plane and the current path having the longest hole movement distance may be set in the <1-100> direction if the main surface is in the a plane. In this way, it is possible to reduce the resistance of the current path having the longest hole movement distance relatively more than the case when the other direction is used. Therefore, the dynamic characteristics of the vertical MOSFET can be improved. In addition, with the arrangements described above, pulling out of holes does not occur in the <0001> direction. This feature also improves the dynamic characteristics.

Figure 6:
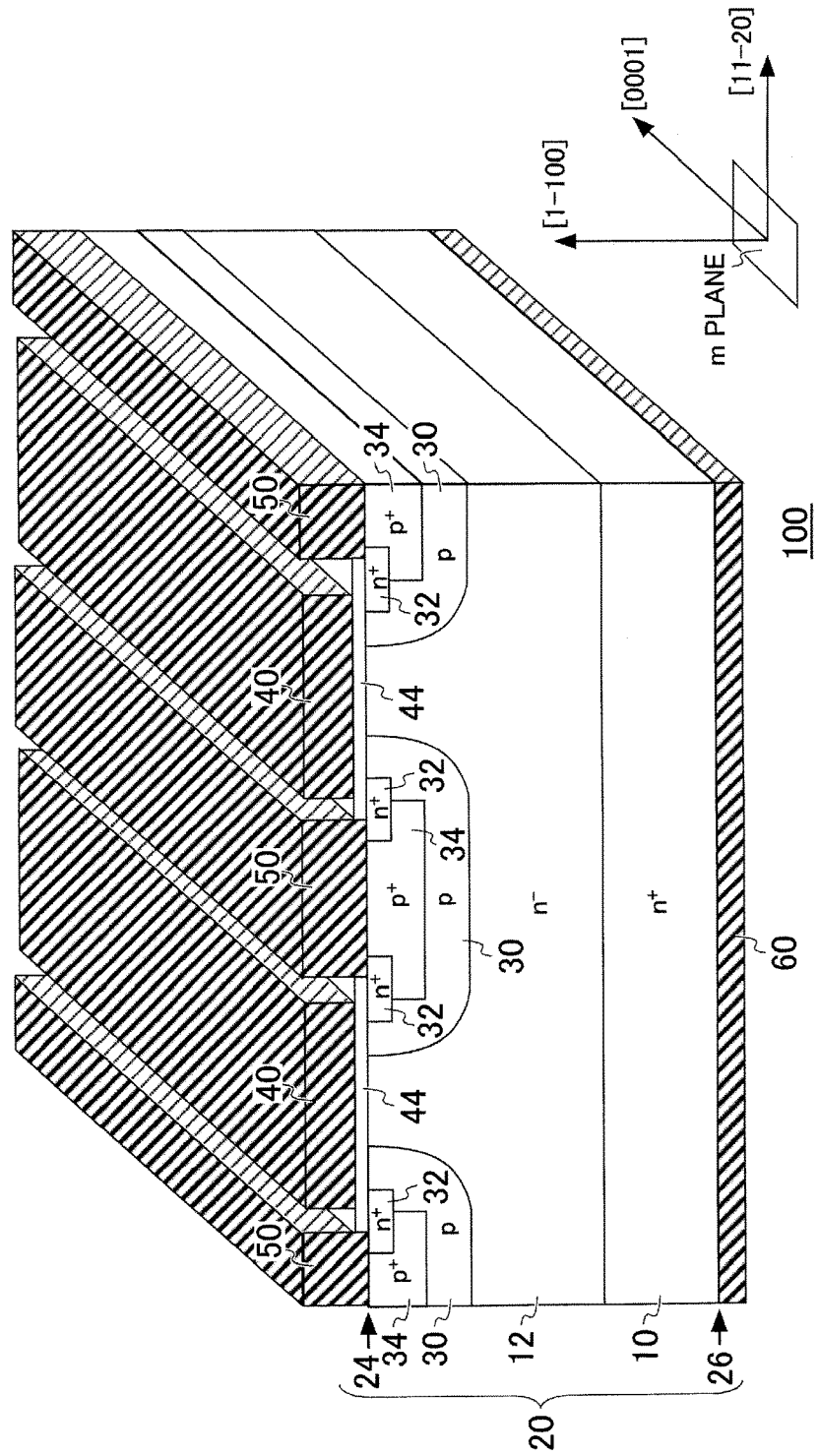
FIG. 6 shows a vertical MOSFET 100 according to a first embodiment.

FIG. 6 shows a vertical MOSFET 100 according to a first embodiment. The vertical MOSFET 100 of this example includes the GaN layer 20, the gate insulating film 44, the gate electrode 40, the source electrode 50, and the drain electrode 60. The GaN layer 20 includes the $n^+$-type GaN substrate 10 and the $n^-$-type GaN layer 12 epitaxially formed on top of the $n^+$-type GaN substrate 10.

The GaN layer 20 of this example has a main surface 24 in a non-polar plane. The non-polar main surface 24 may be in the m plane or the a plane, as described above, and the main surface 24 of this example is in the m plane. The main surface 24 may have an off-angle. The m plane may have an off-angle within ±8° relative to the <0001> direction. By providing an off-angle, the flatness of the epitaxially grown crystal surface can be improved.

In this example, terms such as "top" and "above" refer to a direction that is perpendicular to the main surface 24, from the $n^+$-type GaN substrate 10 toward the $n^-$-type GaN layer 12. On the other hand, terms such as "bottom" and "below" refer to a direction opposite the direction indicated by the terms such as "top" and "above."

The n-type impurity concentration of the $n^+$-type GaN substrate 10 may be greater than or equal to $1E+17$ cm$^{-3}$ and less than or equal to $1E+20$ cm$^{-3}$. The n-type impurity concentration of the $n^-$-type GaN layer 12 may be approximately $1E+16$ cm$^3$. If a withstand voltage of 1200 V is assumed, the thickness of the $n^+$-type GaN substrate 10 may be greater than or equal to 100 μm and less than or equal to 500 μm, and the thickness of the $n^-$-type GaN layer 12 may be 10 μm. In this Specification, E indicates 10 raised to a certain power, e.g. $1E+16$ indicates $1\times10^{16}$.

The $n^-$-type GaN layer 12 can be formed by MOCVD (Metal Organic Chemical Vapor Deposition) using trimethylgallium (TMG), ammonia (NH$_3$), and a suitable carrier gas. The n-type impurities may be one or more types of element from among oxygen (O) and silicon (Si). Instead of using MOCVD, halide vapor phase epitaxy (HVPE) or molecular beam epitaxy (MBE) may be used. The p-type impurities may be one or more types of element from among magnesium (Mg) and beryllium (Be).

The GaN layer 20 has the p-type well region 30 in the main surface 24 thereof. The p-type well region 30 of this example is provided as a stripe shape in the main surface 24. In this example, the long direction of the stripe is the <0001> direction and the short direction of the stripe is the <11-20> direction. The $p^+$-type contact region 34 and the $n^+$-type source region 32 are provided in the main surface 24 side of the p-type well region 30 in this example. The $p^+$-type contact region 34 and the $n^+$-type source region 32 are also provided as stripe shapes, in the same manner as the p-type well region 30.

The p-type impurity concentration of the p-type well region 30 may be $1E+17$ cm$^3$. The p-type impurity concentration of the $p^+$-type contact region 34 may be $4E+19$ cm$^{-3}$. The n-type impurity concentration of the $n^+$-type source region 32 may be $1E+20$ cm$^3$. The impurity doping may be performed according to an ion doping process, or may be performed by selective regrowth or the like to partially form epitaxial layers having prescribed impurity concentrations. As another example, a combination of these techniques may be used.

An electrode with a stripe shape is provided above the p-type well region 30. In this example, the stripe-shaped electrode is the source electrode 50. The source electrode 50 is provided on top of and in direct contact with the p$^+$-type contact region 34 and the n$^+$-type source region 32. In this example, the extension direction of the source electrode 50 is the <0001> direction and the direction orthogonal to the extension direction is the <11-20> direction.

In the p-type well region 30 of this example, a first direction, which is the direction in which the distance travelled by the holes is longest, is the <11-20> direction. The first direction is a direction orthogonal to the extension direction of the stripe-shaped source electrode 50. A second direction, which is orthogonal to the first direction in a plane parallel to the main surface 24, is the <0001> direction. As described above, the hole mobility is higher in the <11-20> direction than in the <0001> direction, among the directions parallel to the main surface 24. Accordingly, it is possible to reduce the resistance of the current path having the longest hole movement distance relatively more than the case when the other direction is used. In this way, the dynamic characteristics of the vertical MOSFET can be improved.

In the transient state, holes are also pulled out in the [1-100] direction from the p-type well region 30 toward the p$^+$-type contact region 34. As described above, the hole mobility is higher in the <1-100> direction than in the <0001> direction. In other words, the resistance in the <1-100> direction is lower than the resistance in the <0001> direction. In this way, by pulling out the holes in the <1-100> direction or the <11-20> direction, it is possible to decrease the resistances for the holes. As a result, the dynamic characteristics of the vertical MOSFET can be improved.

The drain electrode 60 is provided on the other main surface 26, which is positioned on the side opposite the main surface 24 of the GaN layer. The ground potential may be applied to the source electrode 50, and the power supply voltage ($V_{DD}$) may be applied to the drain electrode 60. The source electrode 50 and the drain electrode 60 may each be layered bodies of titanium (Ti) and aluminum (Al). These layered bodies may be formed according to known methods such as sputtering and vapor deposition, and then completed by performing patterning according to a known method.

The gate insulating film 44 is provided in contact with the main surface 24 of the GaN layer 20. The gate insulating film 44 in this example is provided on top of the p-type well region 30 at least at positions where the p$^+$-type contact region 34 and n$^+$-type source region 32 are not formed. The gate insulating film 44 need only be provided on top of the p-type well region 30 where the channel region 36 is formed. The gate insulating film 44 may be silicon oxide with a thickness greater than or equal to 50 nm and less than or equal to 100 nm. The silicon oxide can be formed using a known method such as CVD. The gate electrode 40 is provided on top of the gate insulating film 44. The gate electrode 40 may be a metal film formed of gold (Au), platinum (Pt), nickel (Ni), or an alloy of these metals. In this example, silicon oxide and polysilicon doped with n-type impurities are formed, and then patterning is performed according to a known method to form the gate insulating film 44 and the gate electrode 40.

Figure 7:
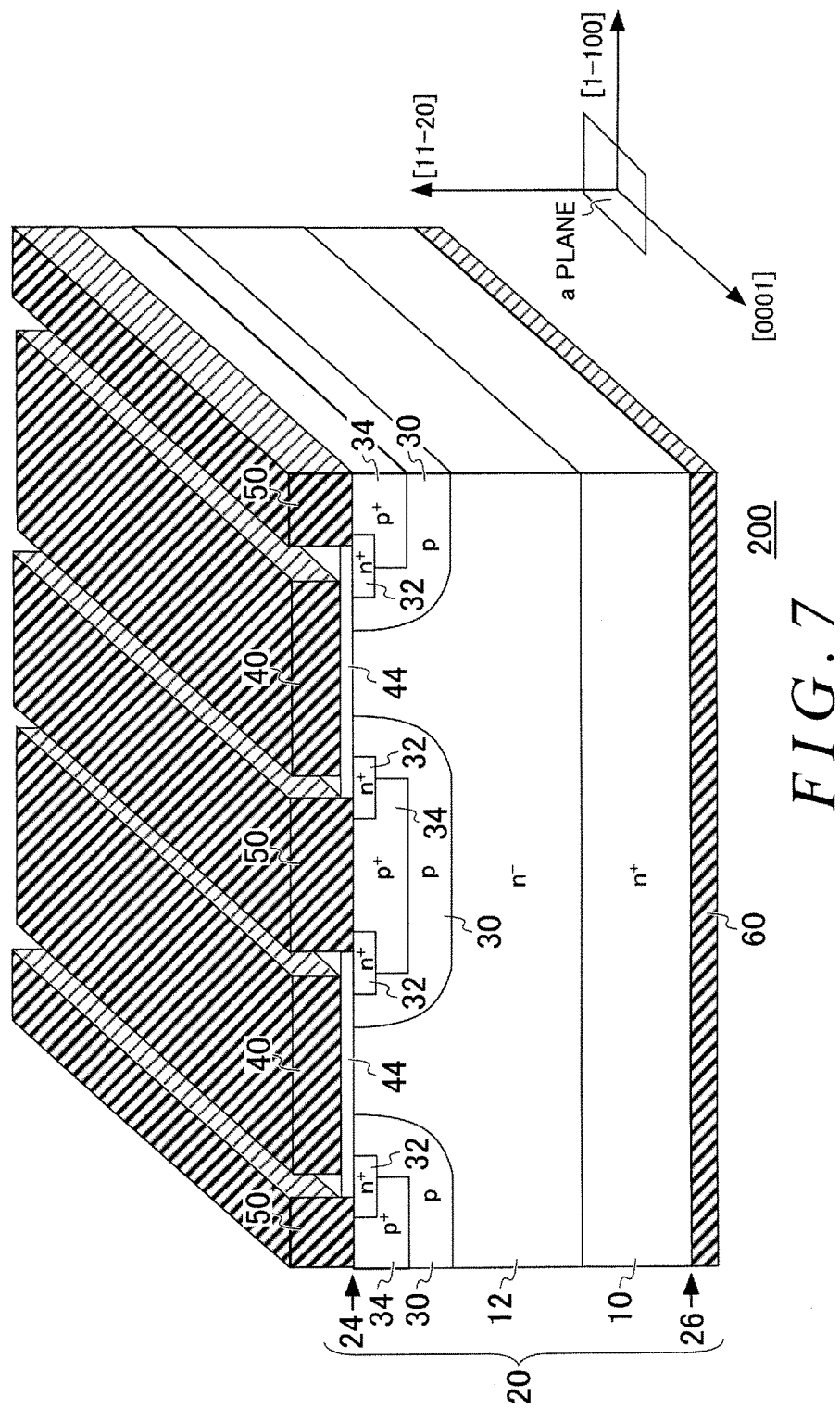
FIG. 7 shows a vertical MOSFET 200 according to a second embodiment.

FIG. 7 shows a vertical MOSFET 200 according to a second embodiment. In this example, the main surface 24 is in the a plane. Furthermore, the extension direction of the source electrode 50 is the <0001> direction and the direction orthogonal to the extension direction in a plane parallel to the main surface 24 is the <1-100> direction. The second embodiment differs from the first embodiment with regard to these points. In this example as well, it is possible to reduce the resistance of the current path <1-100> having the longest hole movement distance relatively more than the case when the other direction is used. In addition, holes are also pulled out in the [11-20] direction from the p-type well region 30 toward the p$^+$-type contact region 34. In this way, the dynamic characteristics of the vertical MOSFET can be improved.

Figure 8:
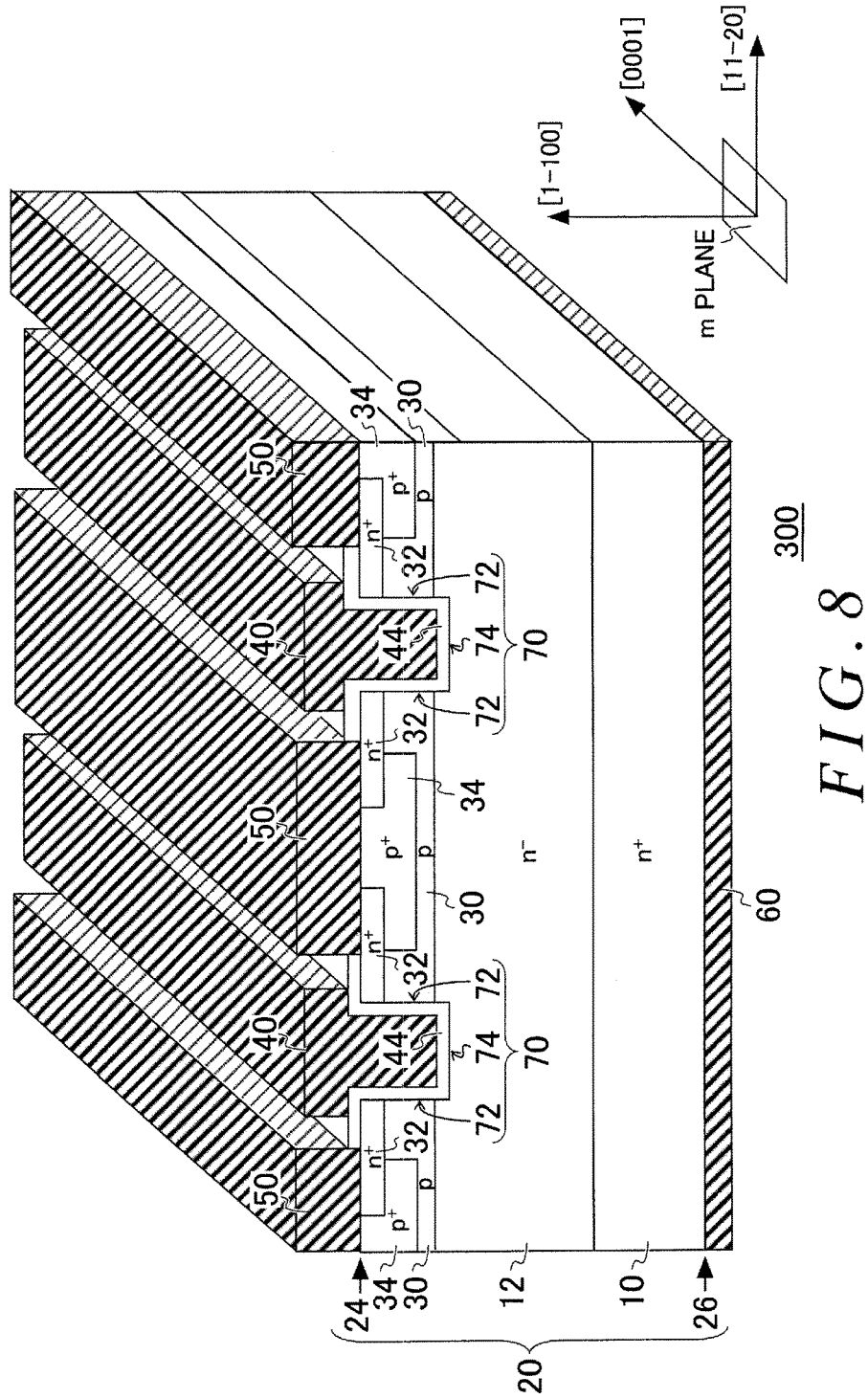
FIG. 8 shows a vertical MOSFET 300 according to a third embodiment.

FIG. 8 shows a vertical MOSFET 300 according to a third embodiment. The vertical MOSFET 300 of this example is a trench gate type including a trench portion 70. The trench portion 70 has side walls 72 and a bottom portion 74. The side walls 72 are provided in contact with the p-type well region 30. The gate insulating film 44 is provided in contact with the side walls 72 and bottom portion 74 of the trench portion 70. The third embodiment differs from the first embodiment with regard to this point. Other points are the same as in the first embodiment, and therefore the dynamic characteristics of the vertical MOSFET can be improved.

Figure 9:
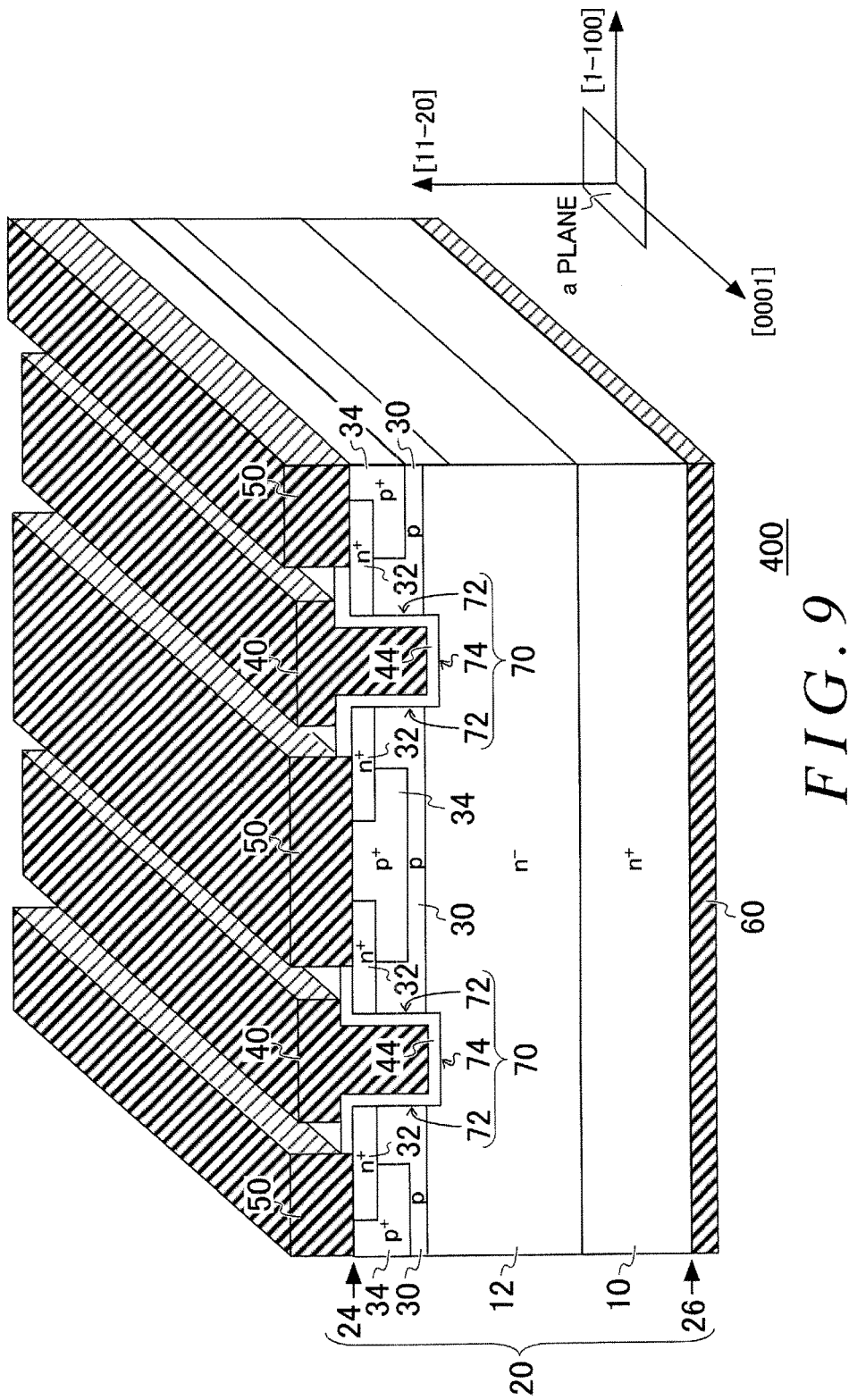
FIG. 9 shows a vertical MOSFET 400 according to a fourth embodiment.

FIG. 9 shows a vertical MOSFET 400 according to a fourth embodiment. The vertical MOSFET 400 of this example is the same trench gate type as in the third embodiment. However, the main surface 24 in this example is in the a plane, in the same manner as in the second embodiment. In this example, the extension direction of the source electrode 50 is the <0001> direction and the direction orthogonal to the extension direction in a plane parallel to the main surface 24 is the <1-100> direction. With this example as well, the dynamic characteristics of the vertical MOSFET can be improved, in the same manner as in the third embodiment.

Figure 10:
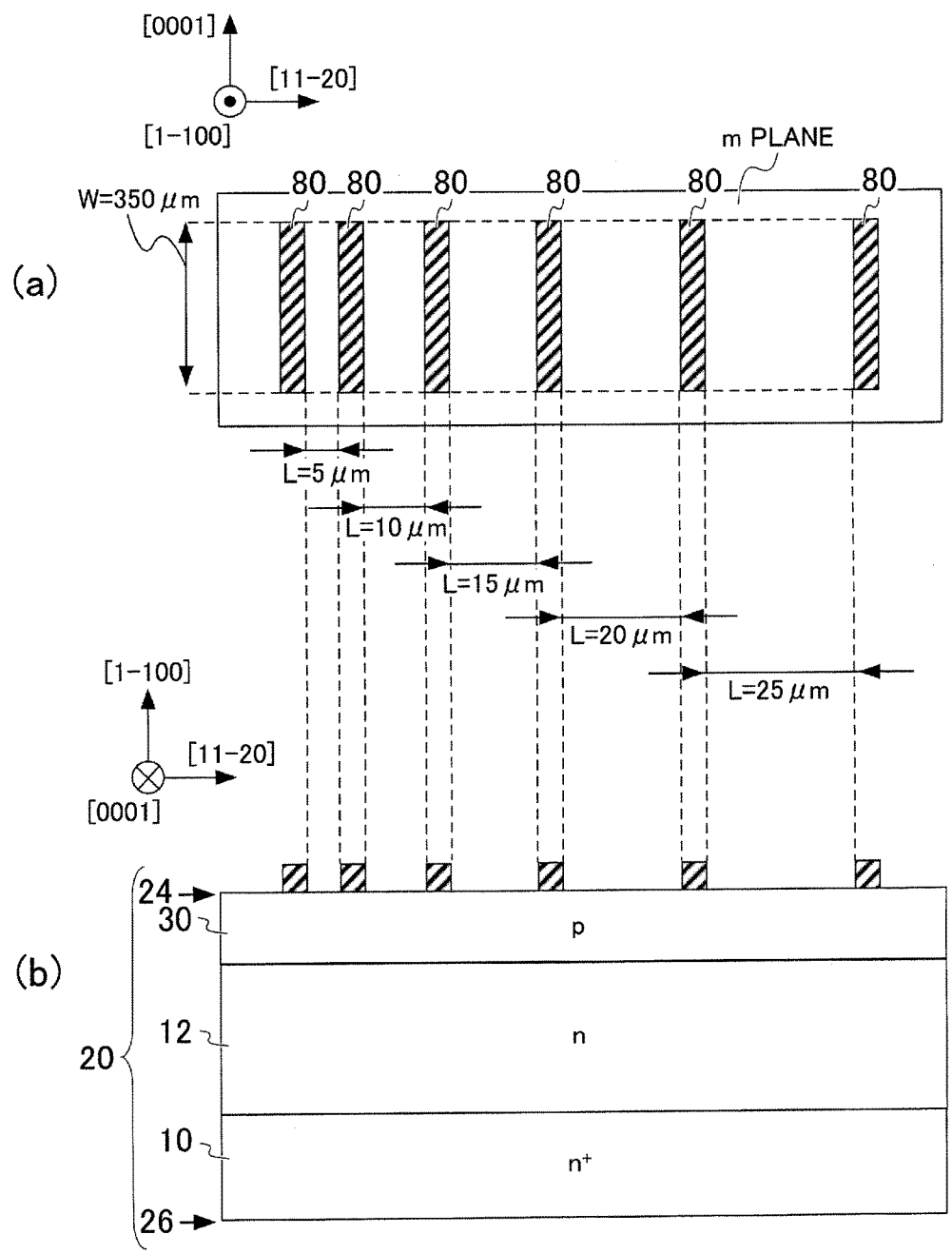
FIG. 10 shows a top view (a) and a cross-sectional view (b) of a first experimental example.

FIG. 10 shows a top view (a) and a cross-sectional view (b) of a first experimental example. In this example, a plurality of electrode layers 80 are provided on top of the main surface 24, which is in the m plane. Each electrode layer 80 is formed by sequentially layering platinum (Pt), nickel (Ni), and gold (Au) in order from bottom to top, and then performing thermal annealing at a temperature of 650° C. in an oxygen atmosphere for 2 minutes. Among the plurality of electrode layers 80, two adjacent electrode layers 80 are distanced from each other by a prescribed interval L in the [11-20] direction. This prescribed interval L was set to each of 5 µm, 10 µm, 15 µm, 20 µm, and 25 µm. The length of each electrode layer 80 in the [0001] direction was 350 µm. The voltage was measured when a constant current of 5 mA was flowing between two adjacent electrode layers 80. In this way, the differential resistance of the p-type well region 30 was calculated as the resistance R. As a result, the graph showing the distance L-resistance value R line of the first experimental example was obtained, as shown in FIG. 12.

Figure 11:
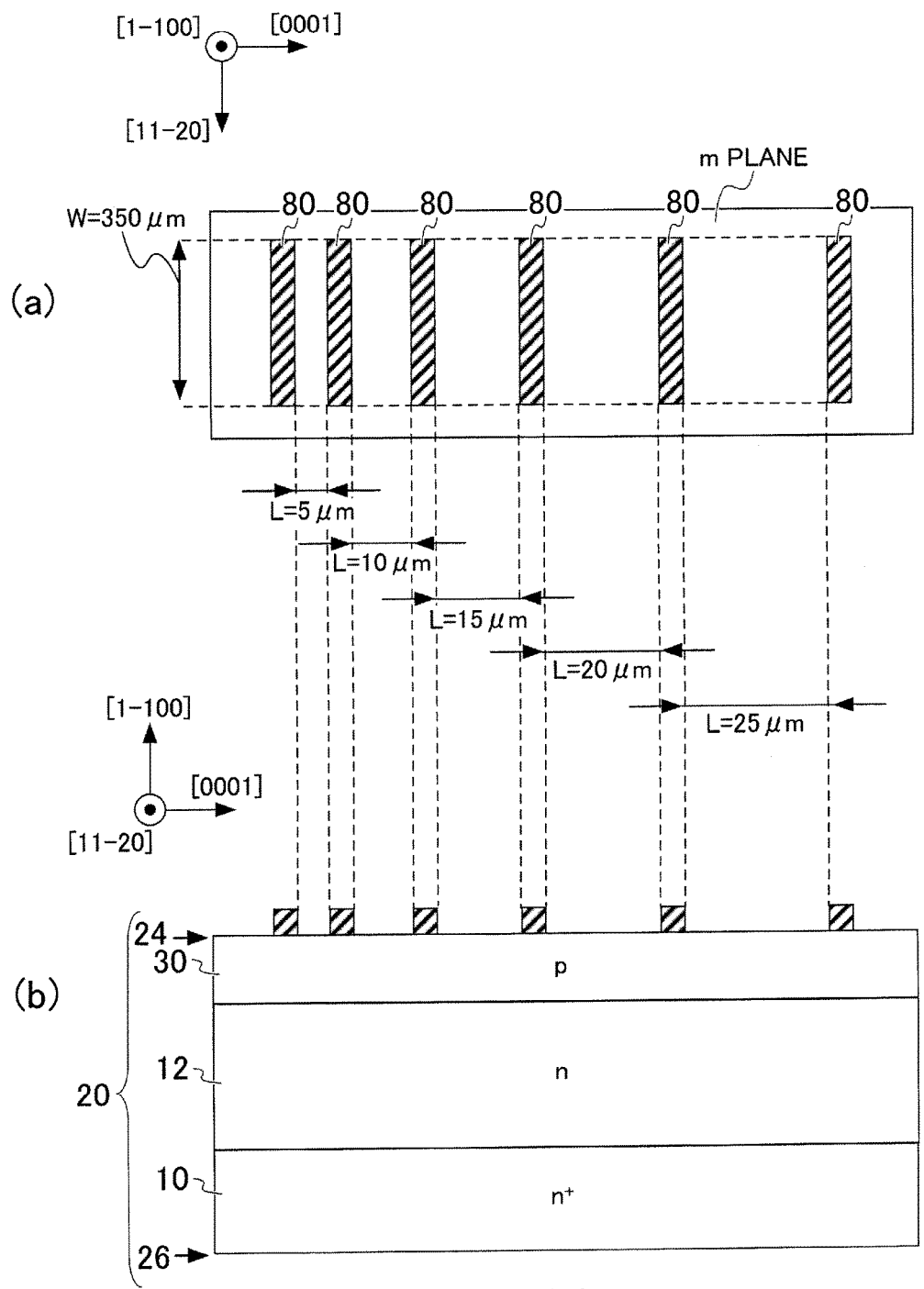
FIG. 11 shows a top view (a) and a cross-sectional view (b) of a second experimental example.

FIG. 11 shows a top view (a) and a cross-sectional view (b) of a second experimental example. In this example, a plurality of electrode layers 80 were arranged at distances from each other in the [0001] direction. The second experimental example differs from the first experimental example with regard to this point. In this way, a graph of the [0001]-direction distance L-resistance value R line was obtained, as shown in FIG. 12.

Figure 12:
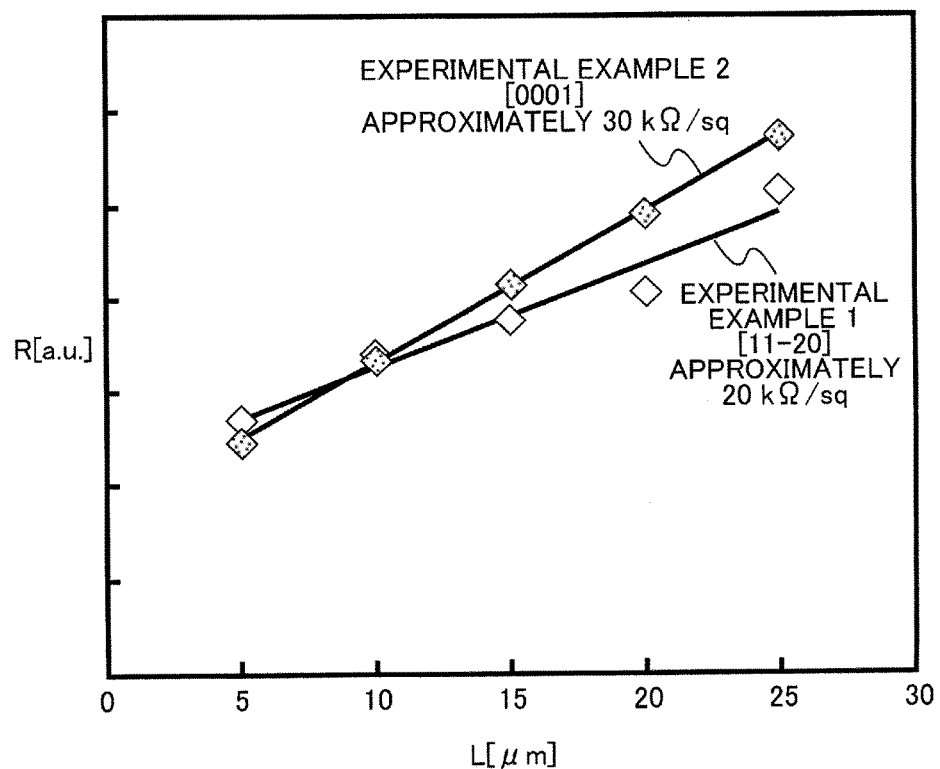
FIG. 12 shows a graph of the resistance value R relative to the distance L between electrode layers 80.

FIG. 12 shows a graph of the resistance value R relative to the distance L between electrode layers 80. The vertical axis R is the resistance value [arbitrary units] and the horizontal axis L is the distance [µm] between electrode layers 80. In this example, in order to remove the metal contact resistance, the sheet resistance of the p-type well region 30 was calculated from the slopes of the graphed lines.

With R representing the resistance, W representing the width of the p-type well region 30 and L representing the length of the p-type well region 30, the sheet resistance $R_s$ is expressed as shown below in Expression 1.

$$R=R_s(L/W) \quad \text{Expression 1}$$

Using Expression 1, the sheet resistance $R_s$ is expressed as shown in Expression 2 below. In the first and second experimental examples, W=350 μm. Furthermore, ΔR/ΔL can be obtained from the slopes of the graphed lines of the experimental examples. In this way, the sheet resistance $R_s$ can be obtained.

$$R_s=(\Delta R/\Delta L)W \quad \text{Expression 2}$$

As shown in FIG. 12, the sheet resistance $R_s$ of the first experimental example is approximately 20 kΩ/sq, and the sheet resistance $R_s$ of the second experimental example is approximately 30 kΩ/sq. In this way, in the m plane, the sheet resistance $R_s$ in the [11-20] direction was confirmed to be less than the sheet resistance $R_s$ in the [0001] direction.

This Specification describes a MOSFET in which the majority carrier causing current flow is electrons. However, the technical ideas described in this Specification may also be applied to an IGBT (Insulated Gate Bipolar Transistor) in which both electrons and holes are majority carriers.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: $n^+$-type GaN substrate, 12: $n^-$-type GaN layer, 20: GaN layer, 22: depletion layer, 24: main surface, 26: other main surface, 30: p-type well region, 32: $n^+$-type source region, 34: $p^+$-type contact region, 36: channel region, 40: gate electrode, 44: gate insulating film, 50: source electrode, 60: drain electrode, 70: trench portion, 74: bottom portion, 72: both sidewalls, 80: electrode layer, 100: vertical MOSFET, 200: vertical MOSFET, 300: vertical MOSFET, 400: vertical MOSFET

What is claimed is:

1. A vertical MOSFET comprising:
   a gallium nitride layer having a main surface that is a non-polar surface;
   a p-type well region that is provided with a stripe shape in the main surface of the gallium nitride layer; and
   a stripe-shaped electrode provided above the p-type well region, wherein
   hole mobility is higher in a direction orthogonal to an extension direction of the stripe-shaped electrode than in the extension direction, among directions in a plane parallel to the main surface, and
   the gallium nitride layer is formed such that a current path in the p-type well region orthogonal to the extension direction of the stripe-shaped electrode is set to be in a <11-20> direction in a case that the non-polar main surface of the gallium nitride layer is in an m plane; and set to be in a <1-100> direction in a case that the non-polar main surface of the gallium nitride layer is in an a plane.

2. The vertical MOSFET according to claim 1, further comprising:
   a p-type contact region and an n-type source region that are provided in the main surface side of the p-type well region;
   a gate insulating film provided at least on top of a region other than the p-type contact region and the n-type source region;
   a gate electrode provided on top of the gate insulating film; and
   a drain electrode provided in contact with another main surface of the gallium nitride layer positioned on a side opposite the main surface, wherein
   the stripe-shaped electrode is a source electrode provided on top of the p-type contact region and the n-type source region.

3. A vertical MOSFET comprising:
   a gallium nitride layer having a main surface in a non-polarized plane; and
   a p-type well region provided on a main surface of the gallium nitride layer, wherein
   in the p-type well region, hole mobility in a first direction, in which a distance travelled by holes is longest, is higher than the hole mobility in a second direction that is orthogonal to the first direction in a plane parallel to the main surface, and
   the gallium nitride layer is formed such that a current path in the p-type well region is set to be in a <11-20> direction in a case that the non-polar main surface of the gallium nitride layer is in an m plane; and set to be in a <1-100> direction in a case that the non-polar main surface of the gallium nitride layer is in an a plane.

* * * * *